United States Patent [19]

Young et al.

[11] Patent Number: 5,280,594
[45] Date of Patent: Jan. 18, 1994

[54] ARCHITECTURE FOR HIGH SPEED CONTIGUOUS SEQUENTIAL ACCESS MEMORIES

[75] Inventors: Elvan S. Young, Cupertino; Philip L. Craine, Saratoga, both of Calif.

[73] Assignee: Advanced Micro Devices, Inc., Sunnyvale, Calif.

[21] Appl. No.: 558,033

[22] Filed: Jul. 25, 1990

[51] Int. Cl.⁵ .................. G06F 13/28; G11C 8/00
[52] U.S. Cl. .................. 395/425; 365/230.04; 364/DIG. 1; 364/244; 364/239; 364/239.51
[58] Field of Search .................. 395/425, 400; 365/230.03, 230.04, 240

[56] References Cited

U.S. PATENT DOCUMENTS

| | | | |
|---|---|---|---|
| 4,680,738 | 7/1987 | Tam | 365/239 |
| 4,805,094 | 2/1989 | Oye et al. | 364/200 |
| 4,954,987 | 9/1990 | Auvinen et al. | 365/189.02 |
| 5,051,889 | 9/1991 | Fung et al. | 364/200 |

*Primary Examiner*—Rebecca L. Rudolph
*Attorney, Agent, or Firm*—Skjerven, Morrill, MacPherson, Franklin & Friel

[57] ABSTRACT

In accordance with the present invention, by interleaving two banks of memory output registers, a memory system is provided which allows an indefinite number of sequential accesses to contiguous locations of the memory system, requiring only a reduced access time per output datum after the first initial access, regardless of whether row address boundaries are crossed.

6 Claims, 5 Drawing Sheets

ARCHITECTURE FOR HIGH SPEED CONTIGUOUS SEQUENTIAL ACCESS MEMORIES

FIELD OF THE INVENTION

This application pertains to the field of high speed memory design; in particular, the present invention pertains to the design of high speed memory for sequential accesses to a contiguous address space.

BACKGROUND OF THE INVENTION

FIG. 1 shows a generalized organization of a memory system, comprising address input register 100, x-and y-decoders 101 and 102 (also known as row and column decoders), a memory array 103, a sense amplifier circuit 104, a memory output register 105, and output buffers 106. In this organization, the address input register 100 receives a two-part address, which is decoded by the x- and y-decoders 101 and 102 to select the corresponding memory cell in memory array 103. The content of the selected memory cell is read by the sense amplifier circuit 104 and latched into the memory output register 105. Register 105 is typically a "see through" latch, such that a transition at the input of the latch is immediately reflected at the output of the latch. "Master-slave" latches are not used in this application because they require two clock edges to operate, therefore necessarily requiring a slower speed of operation. The output buffers 106, having greater current sourcing and sinking capabilities than the memory register 105, provide the output data at specified voltage levels to receiving devices external to the memory system.

In many applications, successive accesses to the memory system are often made to contiguous memory locations. This pattern of memory access, called "sequential access," may be exploited to implement a high performance memory system. One method of taking advantage of this access pattern is by latching into memory output register 105, in addition to the datum corresponding to the specified address, data corresponding to memory cells having addresses contiguous to the specified address. That is, "pre-fetching" data into the memory output register 105 in anticipation of contiguous accesses immediately following. Hence, by storing the additional data fetched in registers, subsequent data may be made available in the period of time required to read each register, which is a time period shorter than that required for the first or "initial" access. With prefetching, the total throughput time for completing a number of sequential accesses is significantly reduced when compared to the total time of individual accesses without prefetching.

FIG. 2 shows an example of a timing scheme in a system having an organization such as shown in FIG. 1. The first data output is provided after a total access time (tAA), as measured from the time address data is made available to the address input register 100, to the time when data output is made available at the memory output buffers 106. In this example, tAA has two components: (i) core access time (tASA), i.e., the period of time between when address data is ready at the address input register 100 to the time when data is ready to be latched at the input terminals of memory output register 105; and, (ii) output enable time (tRCO), i.e. the period of time between when the memory output register 105 is provided an enable signal ("clock") to gate the content of the register onto the output terminals of the register, to the time data output is ready at the output buffers 106. In the ideal case, i.e. data are latched as soon as they are made available to the memory output register 105, tAA is the sum of tASA and tRCO. In the ideal system, where maximum memory access overlap is exploited, the next data stored in next contiguous addresses are ready at the memory output buffers 106 every tRCO after the initial access, rather than every tAA, as required for the initial access. In this mode of access, called "burst" mode, only the initial address is specified, and data from contiguous addresses are provided sequentially thereafter until the burst mode is terminated, or when all the prefetched data are output.

In the prior art, such as the implementation shown in FIG. 3, the ideal speed-up is limited by the number of data prefetched, since an initial access must be made after the last datum is read from the registers in which the prefetched data are stored. FIG. 3 shows, for example, a memory system 30 similar to the memory system shown in FIG. 1 organized such that each bit is selected by the two-part address as discussed above; the row (x-) address part is stored in address counter 300, and the column (y-) address A0–A3 selects which register of the memory output registers R0–R7 is output. This memory system 30's output is 8-bit wide. In this organization, sixty-four bit lines are activated simultaneously, so that the memory array 303 provides simultaneously to registers R0 through R7 sixty four bits (8 bytes) corresponding to eight 8-bit data from eight contiguous addresses. Each 8-bit datum can therefore be provided for output sequentially by selectively enabling the outputs of registers R0 and R7 in order of each datum's address. The necessary enabling signals, or clock signals, are provided by the control logic 307. The registers R0 through R7 are also provided output buffers. However, the maximum number of bytes output in burst mode is limited to the width of the row, i.e. eight in this example. To receive the next eight bytes of data contiguously in the next row, or in the same row, the device requesting memory access must go into a wait state or "stutter", as it is known in the art, until another initial access is made to the required data. It is desirable to have a memory system in which all subsequent accesses are provided in burst mode after the initial access, regardless of whether row boundaries are crossed.

SUMMARY OF THE INVENTION

In accordance with the present invention, two output register banks are provided in a memory system. When enabled, the first register bank latches simultaneously from a first set of bit lines data corresponding to a first set of contiguous addresses. Likewise, when enabled, the second register bank independently latches from a second set of bit lines data corresponding to a second set of contiguous addresses following the first set of contiguous addresses. When the content of first register bank is sequentially output according to addresses of the data therein, the second register bank is being loaded with the data in the second set of bit lines corresponding to the next set of contiguous addresses. The first and second sets of contiguous addresses may involve the same or different word lines. In the same manner, when the content of the second register bank is sequentially output according to addresses of the data therein, the first register bank is being loaded with data from the next set of contiguous addresses following the second set of contiguous addresses. Hence, the present invention provides a continuous stream of burst mode output regardless of row boundaries.

These features and other advantages of the present invention are better understood after considering the following detailed description in conjunction with the accompanying drawings.

DETAILED DESCRIPTION

The present invention provides indefinite number of bytes to be output under burst mode across row boundaries.

Figure 1:
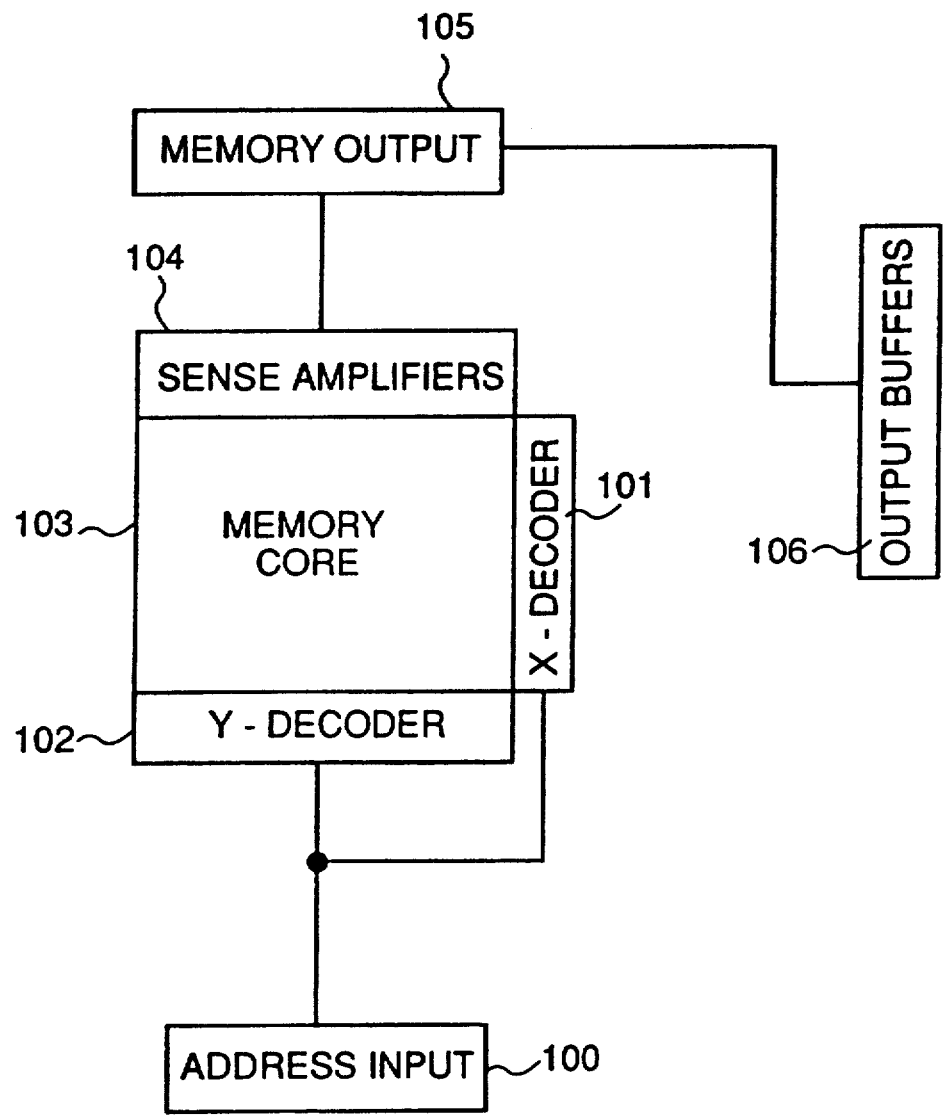
FIG. 1 shows a generalized organization of a memory system.
Figure 2:
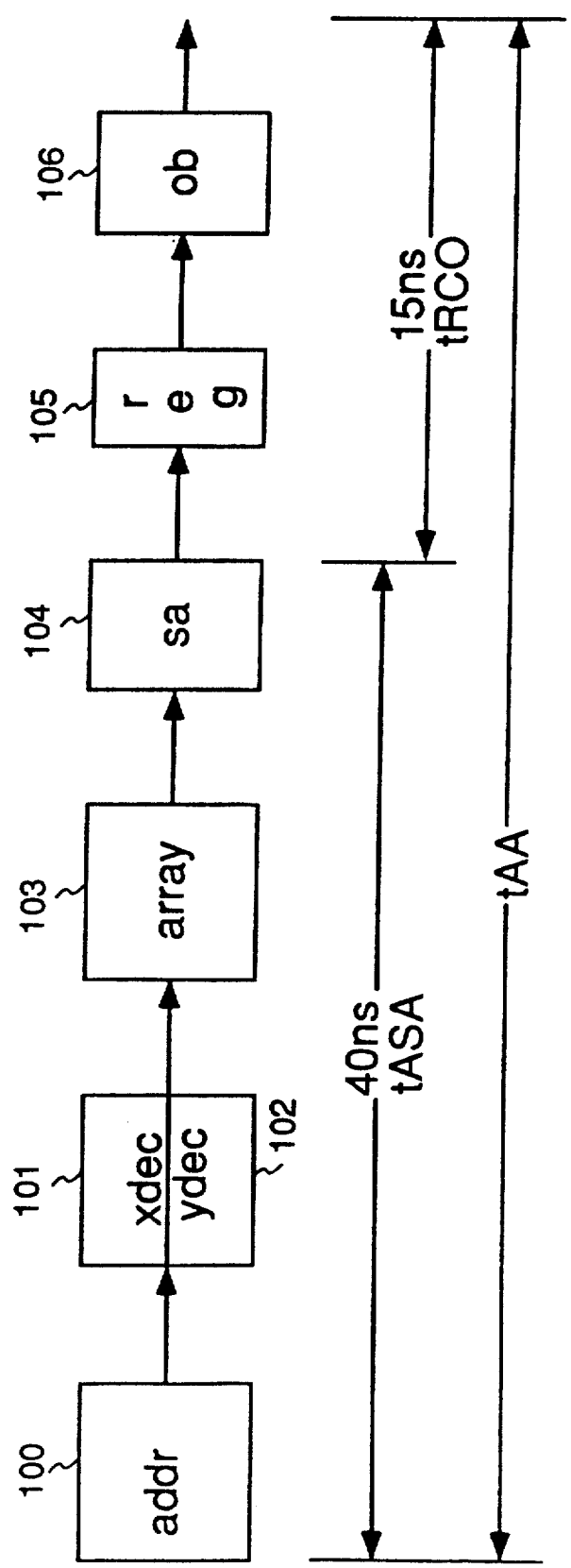
FIG. 2 shows an example of a timing scheme for a memory system having an organization such as shown in FIG. 1.
Figure 3:
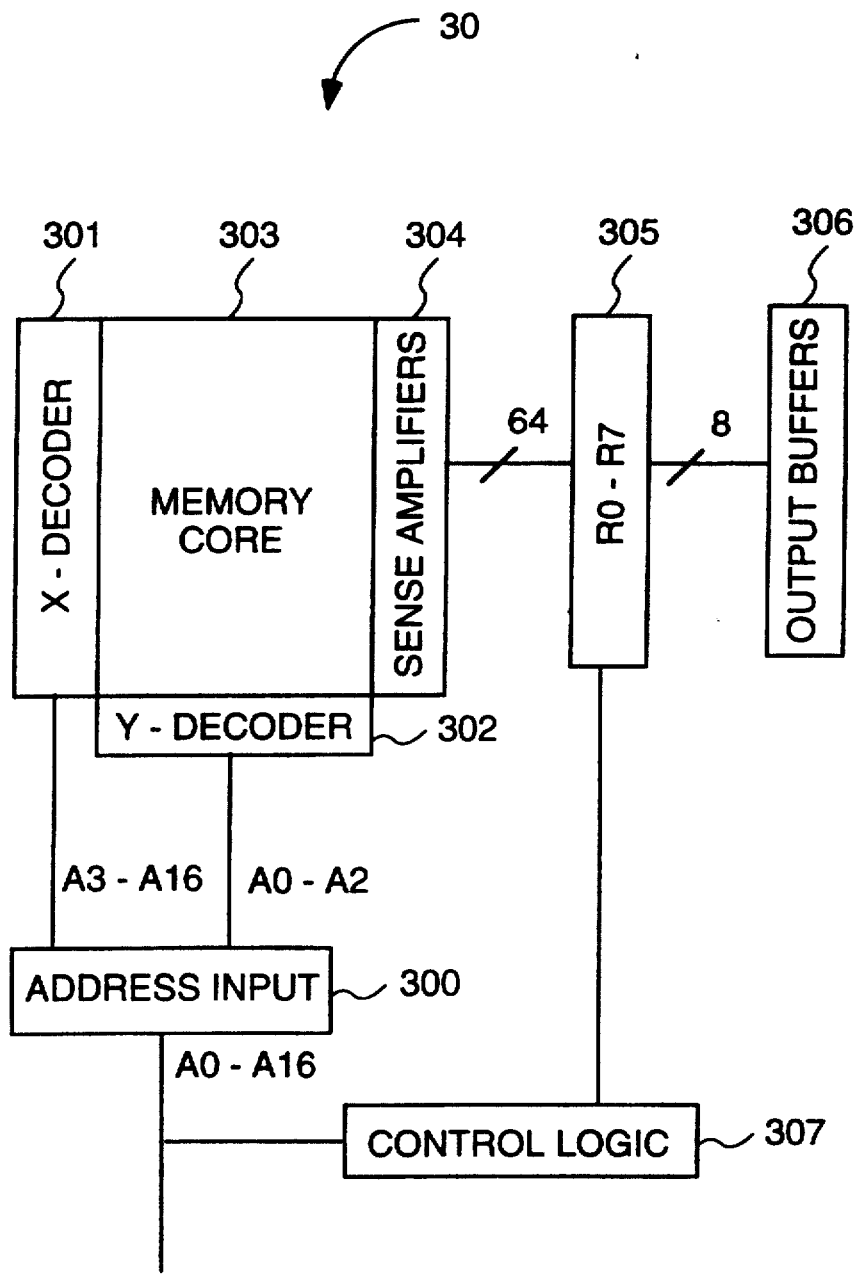
FIG. 3 shows a memory organization 30 allowing a maximum of eight bytes to be output in burst mode.
Figure 4:
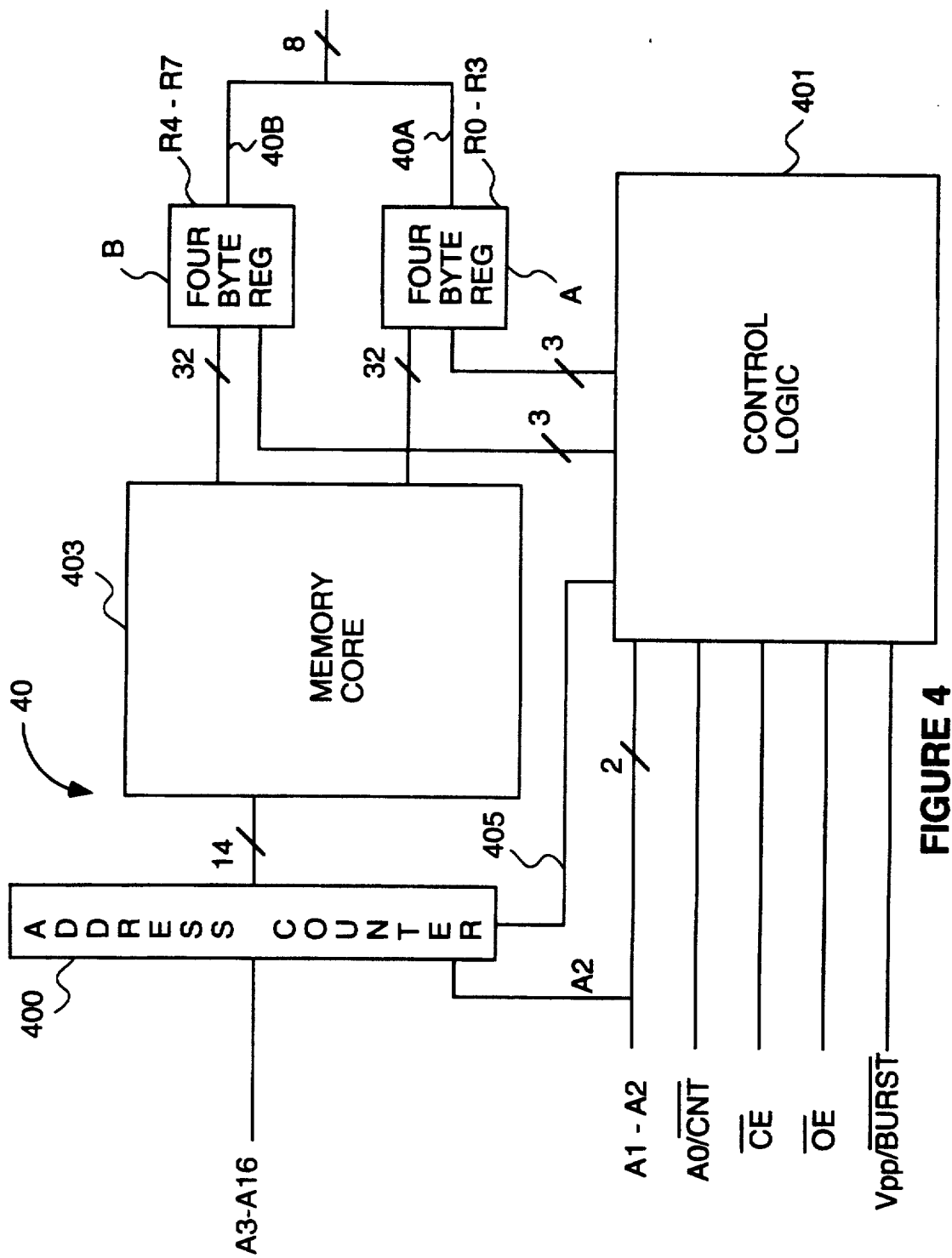
FIG. 4 shows a memory organization 40 allowing indefinite number of bytes to be output under burst mode, in accordance with the present invention.

FIG. 4 shows a memory organization 40 in accordance with the present invention. For the purpose of comparison, it is assumed that the memory systems 30 and 40, shown respectively in FIGS. 3 and 4, have identical number of memory cells. However, instead of having the eight registers R0 through R7 load the output of sixty four bit lines simultaneously, as in memory system 30, the registers of memory system 40 are divided into two banks A and B, corresponding to registers R0-R3 and registers R4-R7 respectively. The memory system 40 multiplexes groups of thirty two bit lines to either register bank corresponding to four bytes of data having four contiguous addresses. In this embodiment, the column addresses are specified by address bits A0-A2. The remaining address bits A3-A16 specifies the row address.

Bank A and bank B are designed to be capable of being loaded at different times. Each register bank is designed such that the total output time of each bank, i.e. the total time between the first byte of the output from the register bank is enabled to the time when the last byte output is available on the respective output bus 40a or 40b, exceeds the memory access time tASA. From the previous discussion, it can be readily seen that the lower limit of this total output time for each register bank is the sum of the output enable times in each register bank, i.e., n times tRCO, where n is the number of registers in the bank. Therefore, each register bank satisfies the relation: n tRCO ≧ tASA.

Figure 5:
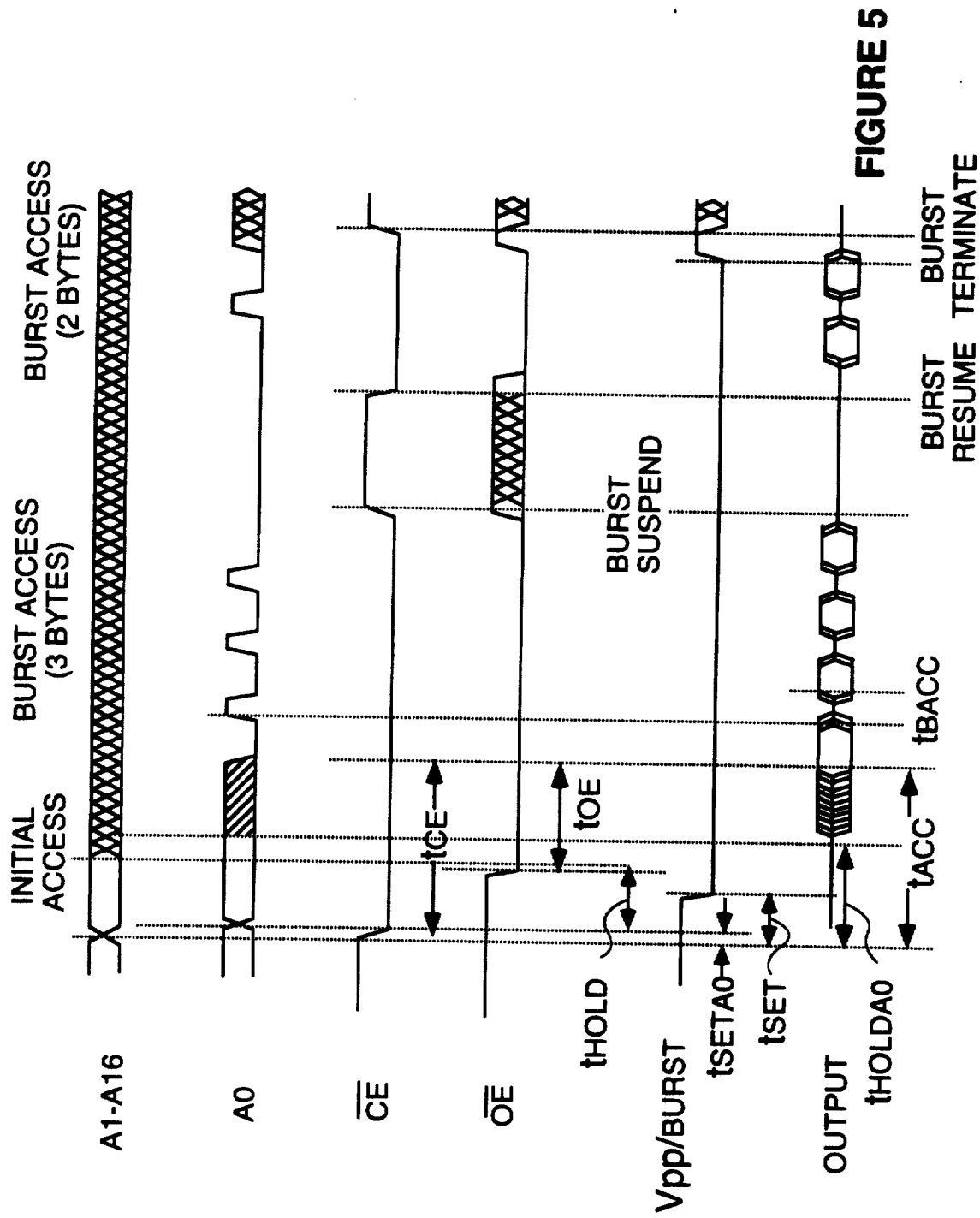
FIG. 5 shows a timing diagram of the memory organization 40 shown in FIG. 4, in accordance with the present invention.

The operation of this memory system 40 is best described in conjunction with the timing diagram of FIG. 5. The memory circuit is enabled by the $\overline{CE}$ (chip enable) signal asserted at logic low, which signals address ready to be latched at address counter 400. In this embodiment, the row address A3-16 is latched into address counter 400. The rest of the address bits, A0-A2 are propagated through control logic 401 and are decoded to provide control signals for output registers R0-R7. In this embodiment also, the first output byte is always taken from register bank A. The signal A2 is provided to address counter 400, so that the access is aligned such that, in the first eight bytes accessed, the first byte to be output will be latched into register bank A. In this embodiment, the initial address is required to be on a 4-byte boundary.

After the initial address is ready for a specified setup time, assertion of the BURST signal (logic low) initiates burst mode operation. In this embodiment, for reasons unrelated to the present invention, the pin receiving the BURST signal is shared with the programming signal Vpp. Burst mode is indicated by logic low on the BURST/Vpp pin, and terminated by asserting logic high on the BURST/Vpp pin. When a high voltage of 12.5 volts is received, programming mode is entered.

The row address portion of the initial address (after alignment in the address counter 400, such that the first byte to output is loaded in register bank A), ripples through the memory array 403, which provides a 64-bit output to the eight registers R0 through R7 as previously described for memory system 30 shown in FIG. 3. After the a specified tOE period following the output enable signal $\overline{OE}$ is asserted (the output enable signal $\overline{OE}$ is asserted after the BURST signal), the initial access is completed by register bank A providing on output bus 40a the datum corresponding to the initial address. This datum is provided by register R0, since the initial address is to be specified on a 4-byte boundary. Every tRCO thereafter, the next datum is sequentially provided in increasing address order. That is, the contents of registers R1 to R3 are gated individually on to the output bus 40a in order in the next three tRCO periods.

In this embodiment, address bit A0 also serves as a "clock" signal during burst mode. After the initial access is completed, address A0 is toggled to signal that the datum in the next sequential address should be output. An external programmable array logic (PAL) circuit, which combines the address with a system clock, may be used to automatically provide toggling of address bit A0 every tRCO, so that the host computer requesting memory access need only specify the initial address and assert the BURST mode signal. Unlike the prior art memory system 30, which requires an initial access after eight bytes of output, bit A0 may be toggled for next data output for as long as BURST mode is asserted. Hence, an indefinite number of bytes may be read under burst mode. This ability stems from interleaving memory output in the two register banks A and B to be described next.

As soon as the data from memory array 403 are latched by the registers R0 through R3 in bank A, an access ("second access") to the next contiguous address is initiated by control logic 401, which sends a signal on line 405 to increment the address counter 400. The data from this second access are ready to be latched into registers R4 through R7 in bank B after tASA. During this time, the toggling of A0 enables sequential output on bus 401 of the contents in registers R0 through R3 every tRCO. Because the initial access time tAA is at best no shorter than the sum of tASA and tRCO, when the data in register R3 is gated on bus 40a, the 32-bit data from the second access, which may be from a different row as the first access, are made available to the registers R4 through R7. The datum in register R4 is therefore made available tRCO after the datum in R3 is output, and the data in registers R5-R7 at the next three tRCO periods thereafter.

It is readily seen that, in order to continue the burst mode access, a third access to provide data to register bank A may be initiated after data from the second access are latched into registers R4 through R7. As long as the output period of each register bank (n times tRCO) is equal or longer than the core access time (tASA), by loading register banks A and B in this interleaving manner, burst mode output may be continued indefinitely. As a result, a continuous stream of data from contiguous addresses are made available every tRCO indefinitely for as long as burst mode is asserted. The limit on the number of data accessible from each initial access under burst mode is therefore removed.

As shown in the timing diagram of FIG. 5, burst mode in this embodiment of the present invention may be suspended by deasserting the CE signal (logic high), and maintaining the Vpp/BURST signal at logic low. Burst mode is resumed when signal CE is reasserted (logic low). In addition, since register banks A and B are loaded alternatively, the sense amplifiers for the memory array output may be multiplexed between the register banks to provide savings in chip area. In the present embodiment, only thirty two sense amplifiers are needed, in contrast to sixty four sense amplifiers in the prior art circuit such as shown in FIG. 3.

It should be noted that, in this example, in order that the next access will be totally hidden from the external circuit requesting data from this memory system 40, the initial access must be to a datum at a 4-byte address boundary to allow sufficient overlap. A scheme removing even this limitation is provided in a copending application entitled "Scheme for Eliminating Page Boundary," by Elvan S. Young et al, Ser. No. 07/557,899, now abandoned filed on the same day as the present invention, assigned to the same assignee as the present invention, and which is hereby incorporated by reference in its entirety.

The embodiments described herein are intended to be illustrative of the general principles of the present invention. It is expected that a skilled person in the art, in consideration of the above description and the accompanying drawings, will be able to derive numerous modifications and variations within the scope of the present invention.

We claim:

1. A memory system receiving a series of contiguous addresses over a series of time period, each of said contiguous addresses comprising a row address field and a column address field, said memory system comprising:

memory array means having a plurality of memory cells for storing data and from which data may be retrieved, said memory array means organized such that, in response to each address of said series of contiguous addresses, a plurality of output data elements are provided corresponding to the contents of memory cells, each memory cell having an address different from the addresses of others of said memory cells only in said column address field, said memory array means having a core access time $t_{ASA}$ less than each of said series of time periods;

a first register bank having a plurality of registers, each for receiving one of said output data elements during the first and every odd time period thereafter within said series of time periods, and for providing as register bank output, during the second and every even time period thereafter with said series of time periods, in sequential column address order and in sequential time intervals, each element of said output data, with each time interval being less than said core access time; and a second register bank having a plurality of registers, each for receiving one of said output data elements during said second time period, and every even subsequent time period thereafter within said series of time periods, and for providing as register bank output, during the third and every odd time period thereafter within said series of time periods, in sequential column address order and in sequential time intervals, each element of said output data, with each time interval being less than said core access time.

2. A memory system as in claim 1, further comprising an address generation means for receiving an initial address and for providing, during said series of time periods, said series of contiguous addresses, beginning with said initial address.

3. A memory system as in claim 1, wherein each of said predetermined plurality output data comprises four bytes of data.

4. A memory system as in claim 2, further comprising means for temporarily halting data output from said first and second register banks upon receipt a halt signal and for resuming data output from said first and second register banks upon receipt of a signal negating said halt signal.

5. A memory device, comprising:

an address generation means for receiving an initial address and for generating in subsequent time periods a set of contiguous addresses, beginning with said initial address;

a memory array, receiving said contiguous addresses, having a core access time $t_{ASA}$, said memory array having a width of n*m*q bits, where n, m and q are integers, q being the width of an output datum of said memory device and n*q being the width of data output from said memory array;

first and second register banks interleaved for receiving said data output from said memory array in response to an address and providing output data of said device, each register bank having n q-bit registers each for receiving a q-bit datum; and a control logic circuit responsive to said initial address for controlling said first and second register bank to, in alternate time periods, receive said n*q-bit data from said memory array and sequentially output a datum from each of said n registers, each register having an output enable time $t_{RCO}$, such that $n* t_{RCO} >= t_{ASA}$.

6. A memory device as in claim 5, wherein said address generation means comprises a programmable logic array.

* * * * *

UNITED STATES PATENT AND TRADEMARK OFFICE
CERTIFICATE OF CORRECTION

PATENT NO.  : 5,280,594
DATED       : 01/18/94
INVENTOR(S) : Elvan S. Young and Philip Craine It is certified that error appears in the above-identified patent and that said Letters Patent is hereby corrected as shown below:

```
Column 5, line 44 delete "period" and insert
--periods--
```

Signed and Sealed this

Fourteenth Day of February, 1995

Attest:

BRUCE LEHMAN

Attesting Officer        Commissioner of Patents and Trademarks